(12) United States Patent
Djelassi-Tscheck et al.

(10) Patent No.: US 11,955,957 B2
(45) Date of Patent: Apr. 9, 2024

(54) SMART ELECTRONIC SWITCH

(71) Applicant: Infineon Technologies AG, Neubiberg (DE)

(72) Inventors: Christian Djelassi-Tscheck, Villach (AT); Michael Asam, Sainbach (DE); Mirko Bernardoni, Villach (AT); David Jacquinod, La Fare les oliviers (FR); Andre Mourrier, Manosque (FR); Mario Tripolt, Ferndorf (AT)

(73) Assignee: Infineon Technologies AG, Neubiberg (DE)

( * ) Notice: Subject to any disclaimer, the term of this patent is extended or adjusted under 35 U.S.C. 154(b) by 37 days.

(21) Appl. No.: 17/455,131

(22) Filed: Nov. 16, 2021

(65) Prior Publication Data

US 2022/0166422 A1    May 26, 2022

(30) Foreign Application Priority Data

Nov. 24, 2020    (DE) .......................... 102020131060.9

(51) Int. Cl.
*H03K 17/082*    (2006.01)
*H03K 17/0814*    (2006.01)

(52) U.S. Cl.
CPC ... *H03K 17/0822* (2013.01); *H03K 17/08142* (2013.01)

(58) Field of Classification Search
CPC ............. H03K 17/08; H03K 17/08104; H03K 17/082; H03K 17/0822; H03K 17/0826; H03K 17/0828; H03K 17/0814; H03K 17/08142; H03K 17/08122; H03K 17/687; H02H 3/08; H02H 3/087; H02H 3/10; H02H 3/105; H02H 3/38; H02H 3/202; B60R 16/03; B60R 16/033
USPC ............... 361/18, 78, 79, 83, 86, 87, 88–92, 361/93.1–102; 363/50–58; 323/274–279
See application file for complete search history.

(56) References Cited

U.S. PATENT DOCUMENTS

| 10,790,657 B2 | 9/2020 | Takuma et al. |
| 2004/0090726 A1* | 5/2004 | Ball ....................... H02H 9/001 361/93.9 |
| 2006/0158808 A1* | 7/2006 | Scheikl ............... H01L 27/0251 361/90 |

(Continued)

FOREIGN PATENT DOCUMENTS

| DE | 102017107889 A1 | 10/2018 |
| DE | 102019121794 A1 | 2/2021 |

(Continued)

*Primary Examiner* — Thienvu V Tran
*Assistant Examiner* — Carlos O Rivera-Perez
(74) *Attorney, Agent, or Firm* — Slater Matsil, LLP

(57) ABSTRACT

In accordance with an embodiment, a circuit for driving an electronic switch includes a control circuit configured to trigger a switch-on and a switch-off of the electronic switch in accordance with an input signal, wherein the control circuit is further configured to trigger the switch-off of the electronic switch in response to an under-voltage signal signaling an under-voltage state; and an under-voltage detection circuit configured to signal the under-voltage state when a supply voltage received at a supply node is below an under-voltage threshold value, wherein the under-voltage threshold value depends on a load current passing through the electronic switch.

20 Claims, 6 Drawing Sheets

(56) References Cited

U.S. PATENT DOCUMENTS

| | | | |
|---|---|---|---|
| 2014/0078629 A1* | 3/2014 | Cortigiani | H03K 17/24 |
| | | | 361/79 |
| 2014/0184664 A1* | 7/2014 | Jang | G09G 5/10 |
| | | | 345/691 |
| 2015/0002161 A1* | 1/2015 | Abdullah | G06F 1/3212 |
| | | | 324/433 |
| 2015/0015215 A1 | 1/2015 | Wu | |
| 2017/0282819 A1 | 10/2017 | Emrani | |
| 2017/0294922 A1* | 10/2017 | Illing | H02H 3/093 |
| 2019/0326745 A1 | 10/2019 | Kramer et al. | |
| 2020/0062200 A1 | 2/2020 | Doernbach et al. | |
| 2021/0050718 A1 | 2/2021 | Djelassi-Tscheck et al. | |

FOREIGN PATENT DOCUMENTS

| | | | |
|---|---|---|---|
| JP | WO2017187785 A1 | 12/2018 | |
| SE | 1550845 A1 | 12/2016 | |

* cited by examiner

SMART ELECTRONIC SWITCH

This application claims the benefit of German Patent Application No. 102020131060.9, filed on Nov. 24, 2020, which application is hereby incorporated herein by reference.

TECHNICAL FIELD

The present disclosure relates to the field of smart electronic switches.

BACKGROUND

In many applications, electrical loads are switched on and off using semiconductor switches. Semiconductor switches that include supplemental circuitry in addition to the electronic switch as such (e.g., a power transistor) are usually referred to as smart electronic switches or simply smart switches. Examples for supplemental circuitry include a temperature sensor for detecting excess temperature, a load current sensor measuring the load current passing through the switch, a voltage comparator for detecting the input voltage, control logic that generates a control signal triggering a switch-on or switch-off dependent on an input signal and measured parameters such as the measured current and temperature, and an interface circuit for outputting measured parameters, etc.

Not only in automotive applications are smart switches increasingly used to replace conventional fuses. Smart switches, which can be used as a substitute for fuses may be referred to as smart fuses or electronic fuses. In these cases, the smart switch may include circuitry which is configured to monitor the measured load current and to trigger a switch-dependent on the load current and a characteristic curve that represents a characteristic of a wire connecting the smart switch and an electric load. Additionally, the above-mentioned supplemental circuitry included in a smart switch may provide a load current limitation function.

When two or more loads are connected to the power supply (e.g., the on-board supply of an automobile) a defective load that draws a relatively high current from the supply (due to the defect) may cause a drop of the supply voltage, which may also affect other loads connected to the same power supply.

SUMMARY

A circuit for driving an electronic switch is described herein. In accordance with one embodiment, the circuit includes a control circuit configured to trigger a switch-on and a switch-off of the electronic switch in accordance with an input signal. The control circuit is further configured to trigger a switch-off of the electronic switch in response to an under-voltage signal indicating an under-voltage state. The circuit for driving an electronic switch further includes an under-voltage detection circuit configured to signal the under-voltage state when a supply voltage received at a supply node is below an under-voltage threshold value, wherein the under-voltage threshold value depends on a load current passing through the electronic switch.

In accordance with another embodiment, the circuit for driving an electronic switch includes a control circuit configured to trigger a switch-on and a switch-off of the electronic switch in accordance with an input signal. The control circuit is further configured to trigger a switch-off of the electronic switch in response to an over-current signal indicating an over-current state. The circuit for driving an electronic switch further includes a current monitoring circuit configured to signal an over-current state based on the current sense signal and a current threshold which depends on a supply voltage received at a supply node.

In accordance with another embodiment, the circuit for driving an electronic switch includes a control circuit configured to trigger a switch-on and a switch-off of the electronic switch in accordance with an input signal, wherein the control circuit is further configured to trigger a switch-off of the electronic switch in response to an over-current signal indicating an over-current state. The circuit for driving an electronic switch further includes a current monitoring circuit configured to signal the over-current state based on the current sense signal and a current-time characteristic which depends on a supply voltage received at a supply node.

BRIEF DESCRIPTION OF THE DRAWINGS

The invention can be better understood with reference to the following drawings and descriptions. The components in the figures are not necessarily to scale; instead emphasis is placed upon illustrating the principles of the invention. Moreover, in the figures, like reference numerals designate corresponding parts. In the drawings.

DETAILED DESCRIPTION OF ILLUSTRATIVE EMBODIMENTS

Figure 1:
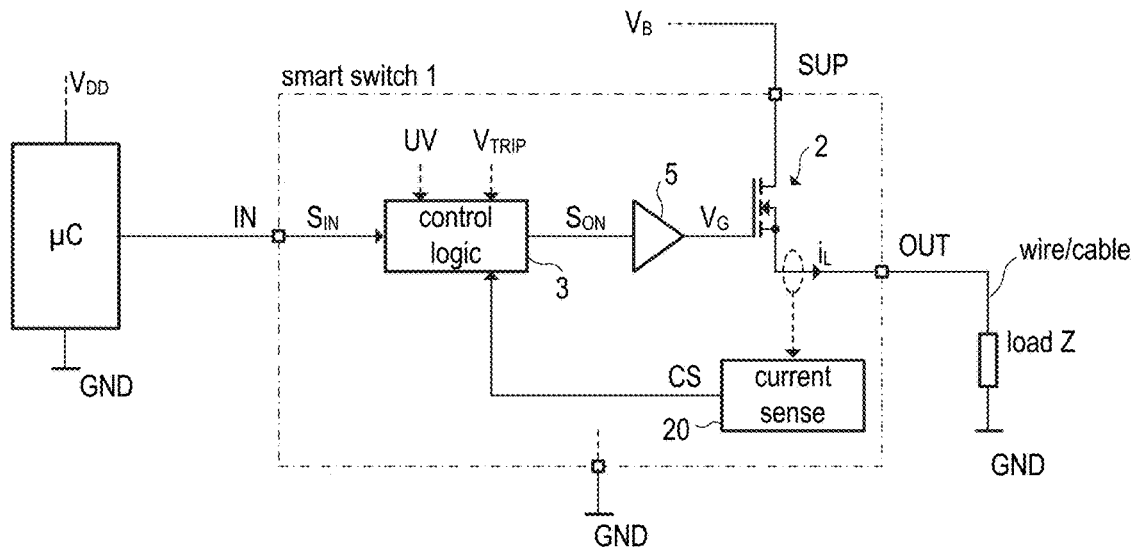
FIG. 1 illustrates a general example of a smart switch.

In the following detailed description, reference is made to the accompanying drawings. The drawings form a part of the description and, for the purpose of illustration, show examples of how the invention may be used and implemented. FIG. 1 illustrates one general example of an integrated smart switch circuit referred to as smart switch 1 in the following. The smart switch 1 may be integrated in a single semiconductor die arranged in a chip package. However, in some embodiments the smart switch 1 may include two or more semiconductor dies arranged in one chip package.

According to FIG. 1, the smart switch 1 includes an electronic switch 2, which may be a power transistor, e.g. a MOS transistor. DMOS transistors may be used as power transistors. Although the examples discussed herein use MOS transistors as power transistor 2 it is understood that other transistor types such as a bipolar transistor may be used instead. A skilled person will have no problem applying the concepts described herein to bipolar transistors. The power transistor 2 is coupled between a supply pin SUP and an output pin OUT of the smart switch 1. Accordingly, the power transistor 2 can connect the output pin OUT to the supply pin SUP when switched on in order to stablish a low-ohmic current path between the pins SUP and OUT. Similarly, the power transistor 2 can disconnect the output pin OUT from the supply pin SUP when switched off. In other words, the power transistor 2 can activate (establish) and deactivate (disconnect) a load current path between the supply pin SUP and the output pin OUT in accordance with the gate signal VG applied to the transistor's gate electrode. It is understood that, if a bipolar transistor is used as power transistor, the transistor is switched on and off in accordance with a base current instead of a gate voltage.

In the example of FIG. 1, the gate signal $V_G$ is provided by a gate driver circuit 5, which is configured to output the gate signal $V_G$ in accordance with a control signal $S_{ON}$, which is a binary logic signal that may only assume a high level (e.g., indicating a switch-on) and a low level (e.g., indicating a switch-off). The control signal $S_{ON}$ is provided by a logic circuit, herein referred to as control logic 3. The control logic 3 may include combinational and sequential logic circuits as well as synchronous and asynchronous circuits. The control logic 3 is configured to trigger a switch-on and a switch-off of the transistor 2 (by generating the control signal $S_{ON}$ with the appropriate logic level) based on the input signal $S_{IN}$, which is received at an input pin IN of the smart switch, and other parameters. The input signal $S_{IN}$ may be generated by an external (separate from the smart switch 1) circuit such as, for example, a microcontroller which is labelled µC in the example of FIG. 1.

It is noted that the input signal $S_{IN}$ is not necessarily received at an input pin of the smart switch. In some embodiments the smart switch may have a digital communication interface, such as, for example, a Serial Peripheral Interface (SPI) or the like that allows receiving data (e.g., from a microcontroller) including switch-on and switch-off commands. In these embodiments, the smart switch may include circuitry that generates the input signal SIN and sets the logic level of the input signal $S_{IN}$ in accordance with the switch-on and switch-off commands received via the digital communication interface.

The above-mentioned "other parameters", which may be processed by the control logic 3 for generating the control signal $S_{ON}$ with a specific logic level (high or low), may include, for example, a measured value representing the chip temperature, a measured value representing the load current $i_L$, configurable threshold values (e.g., an over-temperature threshold), a binary logic signal UV indicating that an input voltage is below a specific threshold value, etc.

The load current $i_L$ that is output at the output pin OUT to a load Z may be measured by a current sense circuit 20. The current sense circuit 20 may, for example, include a sense transistor coupled to power transistor 2 and operated in the same operating point. Current sensing using sense transistors is a well-known technique and thus not discussed in detail herein. For example, the power transistor may be composed of a plurality of transistor cells of a cell array, wherein one or a few transistor cells of the cell array may be used to form a sense transistor. In a simple embodiment, the current sense circuit may include a current sense resistor connected between a load terminal (e.g., the source terminal) of the transistor 2 and the output pint OUT. In this case, the voltage drop across the current sense resistor is indicative of the load current and may be used as current sense signal. A further example of the above-mentioned "other parameters" is a current threshold which may be used to implement an over-current shut-down function. For example, when the current sense signal CS provided by the current sense circuit 20 reaches or exceeds a critical current value represented by threshold value $V_{TRIP}$, then the control logic 3 triggers a switch-off of the transistor 2 until a switch-on is again triggered by the input signal $S_{IN}$.

In the example of FIG. 1, the smart switch 1 is configured as a high-side switch, i.e. the smart switch 1 is connected between a supply line providing the supply voltage $V_B$ (at supply pin SUP) and the load Z, which is connected to the output pin OUT. The smart switch 2 has also a ground pin GND to receive a reference potential $V_{GND}$, which may be defined as 0 volts and serve as constant reference potential for the circuitry included in the smart switch 1.

Figure 2:
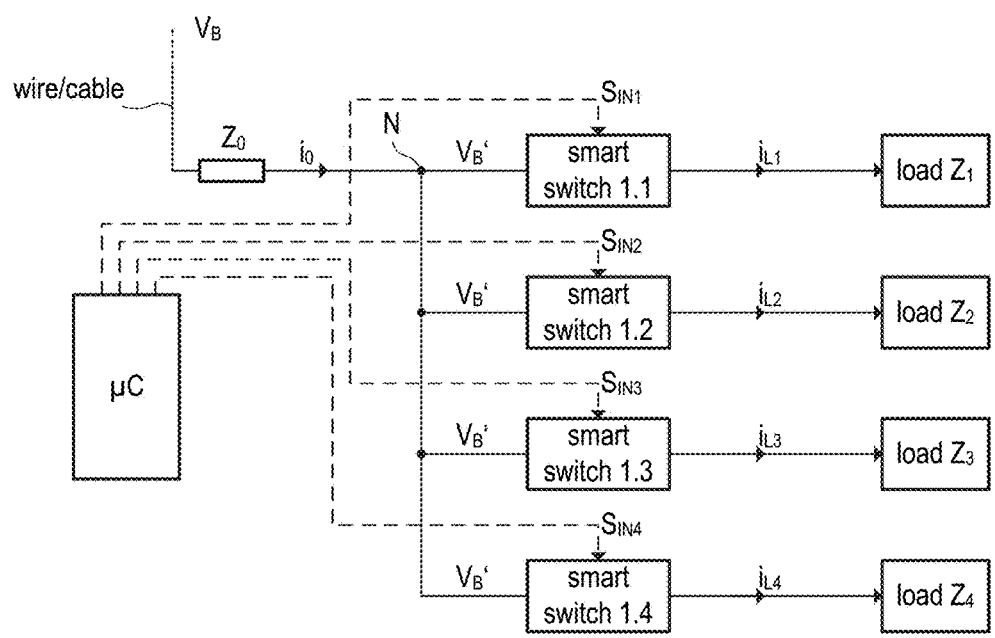
FIG. 2 illustrates the operation of a plurality of loads at the same power supply, wherein each load can be individually switched on and off via a respective smart switch.

FIG. 2 illustrates one example of a system including a plurality (two or more) of electrical loads $Z_1$, $Z_2$, $Z_3$, and $Z_4$, wherein each electrical load $Z_1$, $Z_2$, $Z_3$, and $Z_4$ is connected with the power supply (supply voltage $V_B$) via a respective smart switch 1.1, 1.2, 1.3 and, respectively, 1.4. In practice, the supply pins SUP of the plurality of smart switches 1.1, 1.2, 1.3, and 1.4 will be connected to a circuit node N, which is connected to the voltage source (e.g., an automotive battery) via a comparably long wire or cable. In particular, the cable between the voltage source (not shown in the figures) that generates the supply voltage $V_B$ and the circuit node N will be considerably longer (and have thus a correspondingly high impedance $Z_0$) than the short wirings between the circuit node N and the individual smart switches 1.1, 1.2, 1.3, and 1.4. It is understood that, in FIG. 2, the impedance $Z_0$ does not represent a specific resistor device but rather the intrinsic impedance of the cable/wire between the voltage source (e.g., battery) and the circuit node N. The input signals $S_{IN1}$, $S_{IN2}$, $S_{IN3}$, and $S_{IN4}$, for the smart switches may be provided by a microcontroller µC as in the previous example of FIG. 1. The microcontroller µC and the smart switches 1.1, 1.2, 1.3, and 1.4 may be arranged on the same circuit board which is, however, not necessarily the case. Alternatively, the smart switches 1.1, 1.2, 1.3, and 1.4 may be arranged in different "channels" of a single semiconductor chip.

The load currents passing through the smart switches 1.1, 1.2, 1.3, and 1.4 and the respective loads $Z_1$, $Z_2$, $Z_3$, and $Z_4$, are denoted as $i_{L1}$, $i_{L2}$, $i_{L3}$, and $i_{L4}$. Consequently, the total current $i_0$ passing through the cable between the voltage source, which generates the supply voltage $V_B$, and the circuit node N, equals the sum of the individual load currents $i_{L1}$, $i_{L2}$, $i_{L3}$, and $i_{L4}$ ($i_0 = i_{L1} + i_{L2} + i_{L3} + i_{L4}$). As a result, the supply voltage present at circuit node N is somewhat lower than the voltage $V_B$ due to the voltage drop $i_0 \cdot Z_0$ across the cable impedance $Z_0$ and denoted $V_B'$. That is, $V_B' = V_B - i_0 \cdot Z_0 = V_B - Z_0 \cdot (i_{L1} + i_{L2} + i_{L3} + i_{L4})$. The voltage drops across the short wirings between the circuit node N and the smart switches 1.1, 1.2, 1.3, and 1.4 is negligible for the present discussion as the corresponding impedances are small as compared to the impedance $Z_0$. However, also the voltage drops across the short wirings between the circuit node N and the smart switches may have some effect in practice (cf. FIG. 3).

In practice, situations may occur, in which a load draws—for whatever reason—a comparable high load current. An elevated load current, e.g. load current $i_1$ passing through smart switch 1.1, will result in an elevated total current $i_0$ passing through the wire/cable connecting the voltage source and circuit node N. An elevated total current $i_0$ entails an elevated voltage drop $i_0 \cdot R_0$ across the cable and a correspondingly reduced voltage $V_B'$ at the circuit node N. In other words, the supply voltage "seen" by the loads $Z_1$, $Z_2$, $Z_3$, and $Z_4$, is the voltage $V_B'$ which will dip if one of the loads $Z_1$, $Z_2$, $Z_3$, and $Z_4$ draws an elevated load current.

As discussed above, a single load, e.g. load $Z_1$, which excessively draws current (load current $i_{L1}$ in the present example), for example due to a defect, may cause a voltage dip in the supply voltage $V_B'$, which is also "seen" by all other loads $Z_2$, $Z_3$, and $Z_4$. Such a dip in the supply voltage $V_B'$ may cause undesired effects and malfunctions in these loads $Z_2$, $Z_3$, and $Z_4$ although they are not defective. In a worst case scenario, a defect in one load (load $Z_1$ in the present example) may cause malfunction in all other loads (loads $Z_2$, $Z_3$, and $Z_4$ in the present example) that are supplied via the same circuit node N. To detect such a situation, the microcontroller μC would have to monitor the voltage $V_B'$ at circuit node N (e.g., using an analog-to-digital converter that may be included in the microcontroller) as well as the load currents $i_{L1}$, $i_{L2}$, $i_{L3}$, and $i_{L4}$, and trigger a switch off (by generating an appropriate input signal) of the smart switch connected to the defective load.

Monitoring the load current may be done by the microcontroller PC, for example, by reading out the measured current information from the smart switches 1.1, 1.2, 1.3 and 1.4, e.g., via a digital communication interface (e.g., a Serial Peripheral Interface) or an analog diagnosis output pin (not shown in the figures). Smart switches with diagnosis output pin for outputting measured current information is as such known and thus not further discussed herein. It is evident that the mentioned monitoring functions would render the circuit shown in FIG. 2 significantly more complex.

Figure 3:
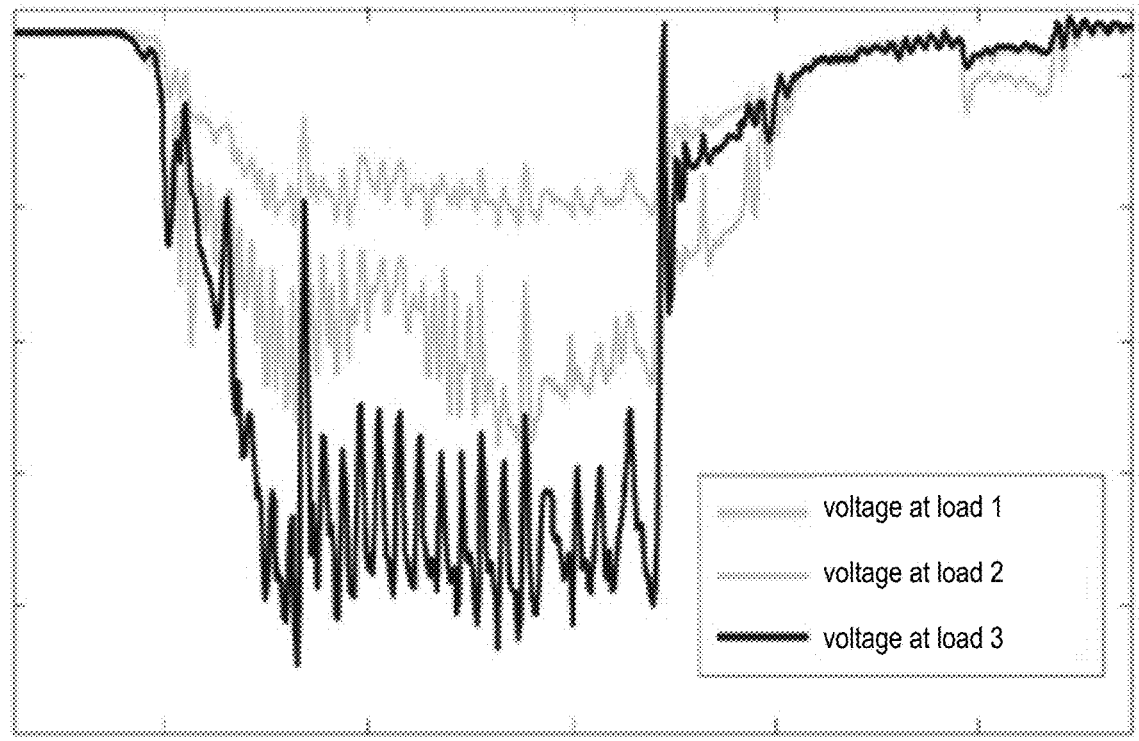
FIG. 3 includes timing diagrams illustrating the desired behavior of a smart switch according to the embodiments described herein.

The diagram of FIG. 3 illustrates exemplary waveforms of the supply voltage ($V_B'$ in the example of FIG. 2) "seen" by different loads. As discussed above, an abrupt load current change and a high current consumption in one load can affect the supply voltage received by the other loads and may cause malfunctions.

Figure 4:
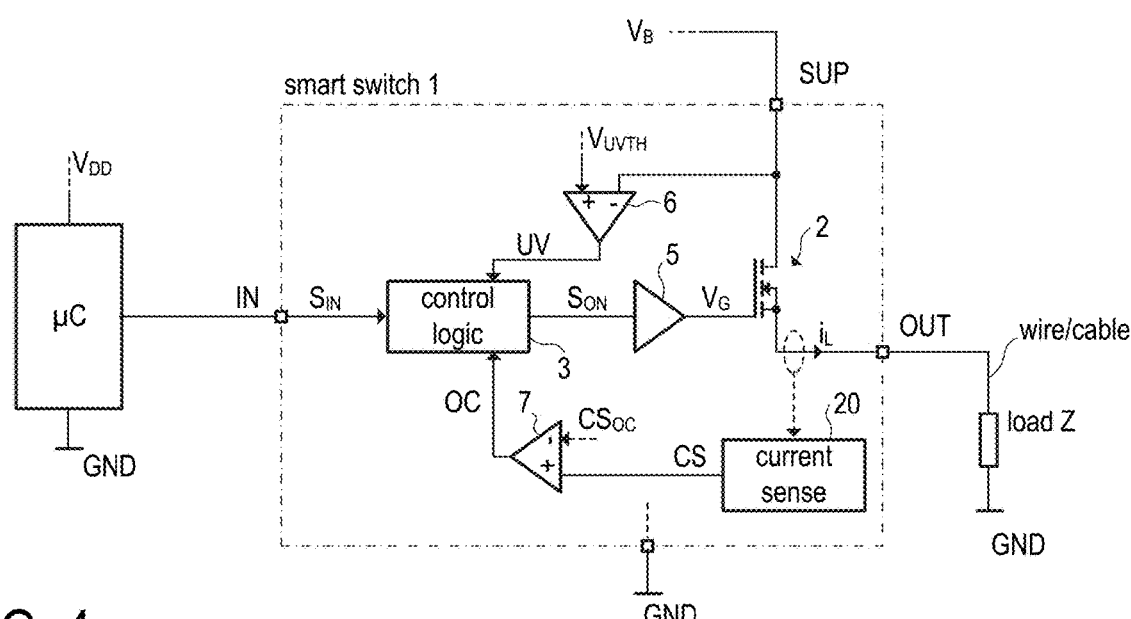
FIG. 4 illustrates one embodiment of a smart switch that can be operated as illustrated in FIG. 3.

The example discussed below with reference to FIG. 4 may improve the situation and avoids the need of implementing the above-mentioned monitoring functions in the microcontroller. FIG. 4 illustrates one embodiment of a smart switch that is capable of detecting a dip in the supply voltage $V_B'$ (i.e., an under-voltage) and trigger a switch-off of the power transistor 2, wherein the respective under-voltage threshold $V_{UVTH}$ can be modified as explained further below.

As can be seen in FIG. 4, comparator 6 is configured to compare the supply voltage $V_B$ received at supply pin SUP with an under-voltage threshold value $V_{UVTH}$. An under-voltage signal UV indicates (e.g., by a high level) that the supply voltage $V_B$ is below the under-voltage threshold $V_{UVTH}$. Similarly, comparator 7 is configured to compare the load current $i_L$ passing through the transistor 2 with an over-current threshold value $CS_{TH}$. An over-current signal OC indicates (e.g., by a high level) that the load current $i_L$ is above the over-current threshold $CS_{OC}$. Examples of the functions of the circuit of FIG. 4 are discussed further below with reference to timing diagrams.

Figure 5A:
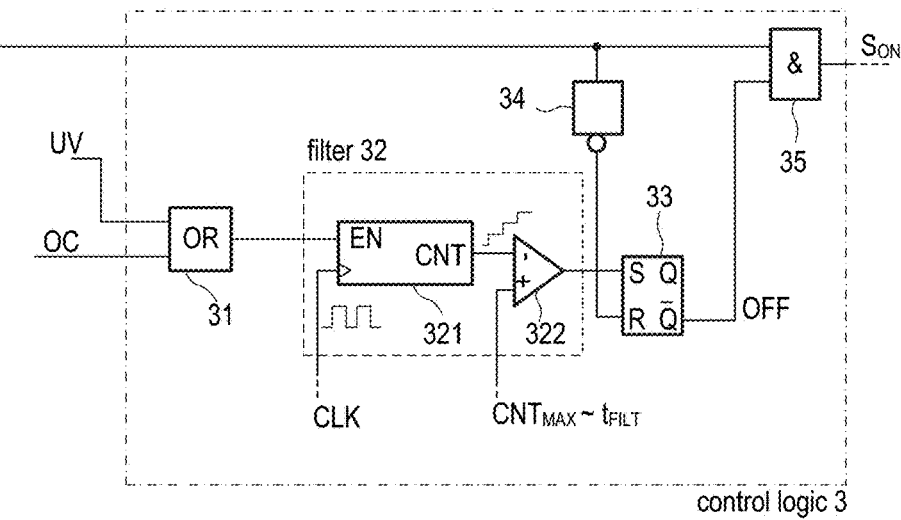
FIGS. 5a and 5b illustrate exemplary implementations of control logic included in the smart switch of FIG. 4.
Figure 5B:
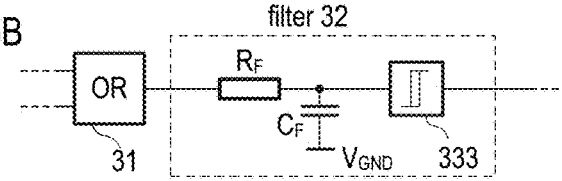

FIGS. 5a and 5b illustrates exemplary implementations of the control logic 3 which may be used in the smart switch of FIG. 4. It is understood that only those parts and components of the control logic 3 that are relevant for the following explanations are depicted in FIGS. 5a and 5b. Other parts and components, which are not shown, may be implemented in the same way as it is done in existing smart switches.

In accordance with FIG. 5a, the control logic 3 receives the output signals of comparators 6 and 7, i.e. the signals UV and OC, respectively. The purpose and the function of comparators 6 and 7 have already been discussed above and reference is made to FIG. 4 and the respective explanations. In the embodiment of FIG. 5a, the control logic 3 includes an OR-gate 31 that receives the signals UV and OC. The output signal of OR-gate 31 will assume a high level when one of the signals UV and OC indicates a supply voltage $V_B'$ below the threshold $V_{UVTH}$ or, respectively, a load current $i_L$ at or above the current threshold value $CS_{OC}$. The output of the OR-gate 31 is supplied to filter 32, which is configured to blank short pulses (shorter than a filter time $t_{FILT}$) at the output of OR-gate 31. When the output signal (logic conjunction UV or OC) of the OR-gate 31 changes from a low level to a high level and the high level is maintained for at least the filter time $t_{FILT}$, then the output of the filter 32 follows the output of the OR-gate 31 and also changes from a low level to a high level.

The output signal of the filter 32 changing to a high level indicates that one of the conditions (i.e., $CS \geq CS_{OC}$ or $V_B' \leq V_{UVTH}$) have been fulfilled for at least a time span that equals the filter time $t_{FILT}$. The output of filter 32 is connected to the set-input of SR-latch 33 (also referred to as SR flip-flop) and, thus, the SR-latch 33 is set when the output signal of filter 32 changes to a high level. The inverted output $\overline{Q}$ of the SR-latch 33, which provides the signal OFF, changes to a low level (i.e. $\overline{Q}=0$) when the SR-latch 33 is set. The signal OFF being at a low level indicates that the power transistor 2 is to be switched off irrespective of the logic level of the input signal $S_{IN}$. The control signal $S_{ON}$, which is supplied to the gate driver 5 (see FIG. 3), is generated by AND-gate 35 that receives, at its inputs, the input signal $S_{IN}$ and the signal OFF. Basically, the AND-gate 35 is transparent for the input signal $S_{IN}$ when the SR-latch is in a reset state (i.e., $\overline{Q}=1$), but it blanks the input signal $S_{IN}$ when the SR-latch is in a set state (i.e., $\hat{Q}=0$). The SR-latch 33 will be not reset until the input signal $S_{IN}$ returns to a low level (which must be triggered by an external circuitry such as the microcontroller μC in FIG. 4). A low level of the input signal $S_{IN}$ causes a reset of the SR-latch 33, which receives the inverted input signal (generated by inverter 34) at its reset input.

The filter 32 may be implemented in various ways. In the example of FIG. 5a, the filter 32 includes a counter 321 which has an enable input EN receiving the output signal of OR-gate 31. Accordingly, the counter 321 is started when the logic conjunction UV or OC indicates that one of the conditions, $CS \geq CS_{OC}$ or $V_B' \leq V_{UVTH}$, are fulfilled at the same time. When enabled, the counter 321 will increase the counter value CNT in each lock cycle of a clock signal CLK, which is supplied to a clock input of the counter 321. If the counter 321 is still enabled after $CNT_{MAX}$ clock cycles, the counter value CNT will reach the reference value $CNT_{MAX}$. The situation $CNT=CNT_{MAX}$ can be detected by comparator 322, which is configured to compare the counter value CNT and the reference value $CNT_{MAX}$. The output of the comparator 322 provides the output signal of the filter 32 which is supplied to the set input of the SR-latch 33 as explained above. The reference value $CNT_{MAX}$ and the clock frequency $f_{CLK}$ of the clock signal CLK define the filter time $t_{FILT}$, i.e. $t_{FILT}=CNT_{MAX}/f_{CLK}$. It is understood, that the comparator 322 may be a digital comparator, which compares two register values, wherein one register value represents the counter value CNT and the other register value represents the reference value $CNT_{MAX}$.

FIG. 5b illustrates an alternative implementation of the filter 32. Accordingly, the filter 32 includes an RC-lowpass composed of resistor $R_F$ and capacitor $C_F$ and configured to filter the output signal of the OR-gate 31. The output signal of the RC-lowpass is supplied to a comparator 333 with hysteresis (Schmitt trigger). The comparator thresholds and the time constant ($\tau_F = R_F \cdot C_F$) of the RC-lowpass filter are designed such that the output of the comparator 333 changes from a low level to a high level only if the high-level at the output of the OR-gate 31 is maintained for at least the filter time $t_{FILT}$.

Figure 6:
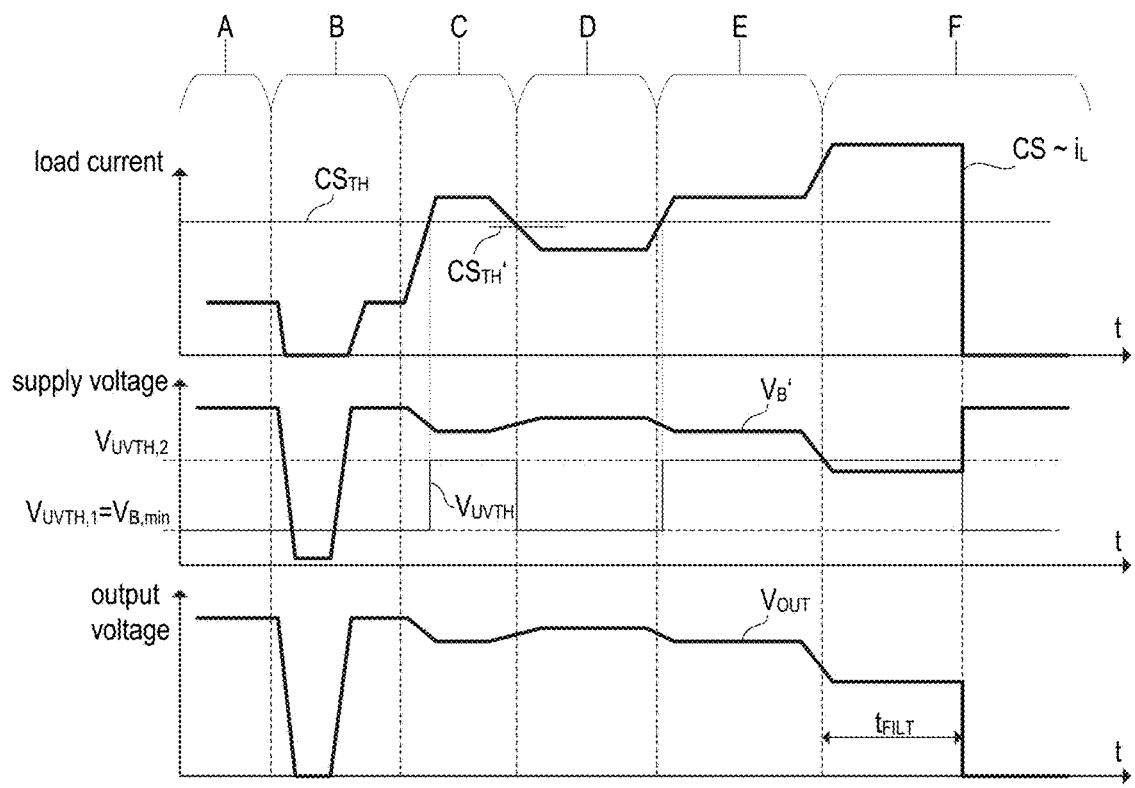
FIGS. 6 and 7 include timing diagrams fur further illustration of the function of the circuit of FIG. 5.

The possible functioning of the embodiments of FIGS. 5a and 5b is further illustrated by the timing diagram of FIG. 6. The examples described below aim at avoiding the need for an independent external voltage and current measurement by an external controller by employing an "intelligent" under-voltage detection approach for providing a highly available power supply. The timing diagram of FIG. 6 illustrates one example, according to which the under-voltage threshold $V_{UVTH}$ depends on the load current $i_L$. Accordingly, the control logic 3 (cf. FIGS. 4 and 5a-5b) may include an under-voltage detection circuit (e.g., comparator 6) configured to signal an under-voltage state when the supply voltage $V_B'$ received at the supply pin SUP is below the under-voltage threshold value $V_{UVTH}$ that depends on the load current $i_L$ passing through the power transistor 2. The timing diagram of FIG. 6 includes six subsequent time intervals (denoted A-F) illustrating different situations.

In time interval A the under-voltage threshold value $V_{UVTH}$ is at a first value $V_{UVTH,1}$, which may correspond to, for example, the minimum supply voltage $V_{B,min}$ that is required for a proper operation of the overall circuit. Also, in time interval A, the load current is relatively low, i.e. below an over-current threshold value $CS_{TH}$.

In timer interval B, the supply voltage $V_B'$ drops (for whatever reason) below the first under-voltage threshold value $V_{UVTH}=V_{UVTH,1}$ which results in the comparator 6 detecting an under-voltage state that is signaled by under-voltage-signal UV. Consequently, the control circuit 3 triggers a switch-off of transistor 2 and the load current drops to zero. Later in time interval B the transistor 2 is again switched on, e.g. by an appropriate input signal $S_{IN}$.

In time interval C, the load current $i_L$ increases for whatever reason, and the current sense signal CS increases accordingly. At some time instant the current sense signal CS reaches or exceeds a first current threshold value $CS_{TH}$, whereupon the under-voltage threshold value $V_{UVTH}$ is adjusted and increased from the first value $V_{UVTH,1}$ to a second value $V_{UVTH,2}$. This situation (in which the under-voltage threshold value is increased) is referred to as over-current operation. Later in time interval C, the load current $i_L$ again decreases so that the current sense signal CS falls below a second current threshold value $CS_{TH}'$. As a consequence, the under-voltage threshold value $V_{UVTH}$ is again adjusted and reset to the first value $V_{UVTH,1}$. The first and the second current threshold may be equal, i.e. $CS_{TH}=CS_{TH}'$, but may also differ by a small amount ($CS_{TH}'=CS_{TH}-\varepsilon$) to obtain a small hysteresis and avoid undesired toggling.

In timer interval D the circuit is in normal operation, i.e. the under-voltage threshold value $V_{UVTH}$ is at the first value $V_{UVTH,1}$ and the conditions $V_B'>V_{UVTH,1}$ and $CS<CS_{TH}$ are fulfilled. Around the transition between time intervals D and E the load current again increases and the circuit again changes over to over-current operation ($V_{UVTH}=V_{UVTH,2}$) in time interval E.

At the transition between time intervals E and F, the supply voltage $V_B'$ drops—during over-current operation of the circuit—below the second (higher) under-voltage threshold value $V_{UVTH,2}$ which results in a switch-off of the transistors 2 after the filter time $t_{FILT}$ has elapsed.

The actual values of $V_{UVTH,1}$, $V_{UVTH,2}$ and $CS_{TH}$ (and optionally $CS_{TH}'$), as well as the filter time $t_{FILT}$ may be programmable parameters (e.g., via a digital communication interface such as SPI). A smart switch with an adjustable under-voltage threshold value which depends on the load current as shown in FIG. 6, may be used in a power distribution network, e.g. in an automobile. It may be used for safety critical applications (e.g., power steering) as well as for supplying non-safety-critical loads (e.g., air conditioning). It is understood that the functionality shown in FIG. 6 can be combined with an over-current shut-down or current limitation mechanism, which may be triggered at higher load currents well above the current threshold value $CS_{TH}$. In practical applications, the filter time $t_{FILT}$ may be different for different switches so that, for example, less safety-critical loads are switched off earlier in case of an under voltage state than the more safety-critical loads.

Figure 7:
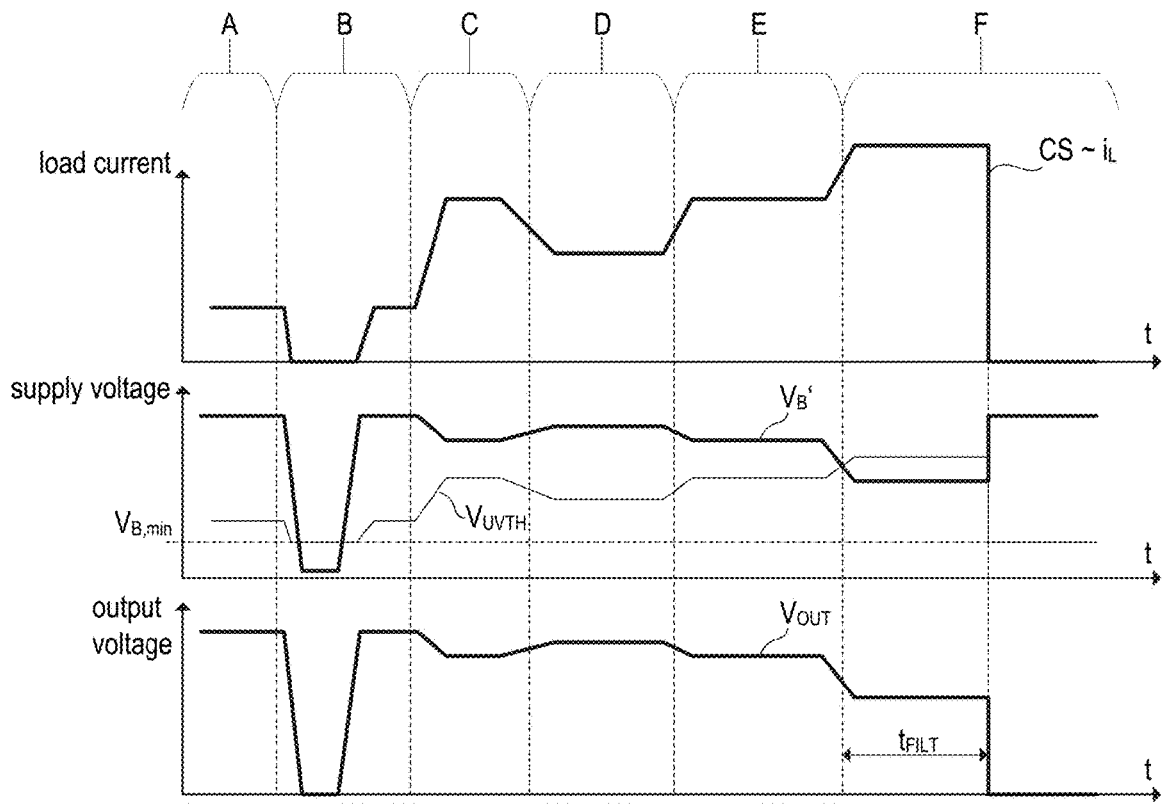

The timing diagram of FIG. 7 shows a further example similar to the example of FIG. 6. However, according to FIG. 7, the under-voltage threshold value $V_{UVTH}$ is not increased in one step from the minimum value $V_{UVTH,1}$ to $V_{UVTH,2}$ but rather proportionally to the load current. Accordingly, in the example of FIG. 7, the under-voltage threshold value $V_{UVTH}$ can be determined as follows: $V_{UVTH}=V_{B,min}+k \cdot CS$, wherein k is a constant scaling factor. Apart from the way the under-voltage threshold value $V_{UVTH}$ is determined, the explanations of FIG. 6 also apply to FIG. 7 and reference is made thereto.

In the examples discussed above, the under-voltage threshold value depends on (i.e., is a function of) the load current $i_L$ (and thus on the current sense signal CS), whereas the current threshold value $CS_{TH}$ is a configurable parameter (and optionally also the value $CS_{TH}'$ if a hysteresis is implemented), which is substantially constant during operation. However, in the following examples, the current threshold value $CS_{TH}$ is a function of the supply voltage $V_B'$, whereas the under-voltage threshold $V_{UVTH}$ is substantially constant and essentially corresponds to the minimum required supply voltage $V_{B,min}$.

Figure 8:
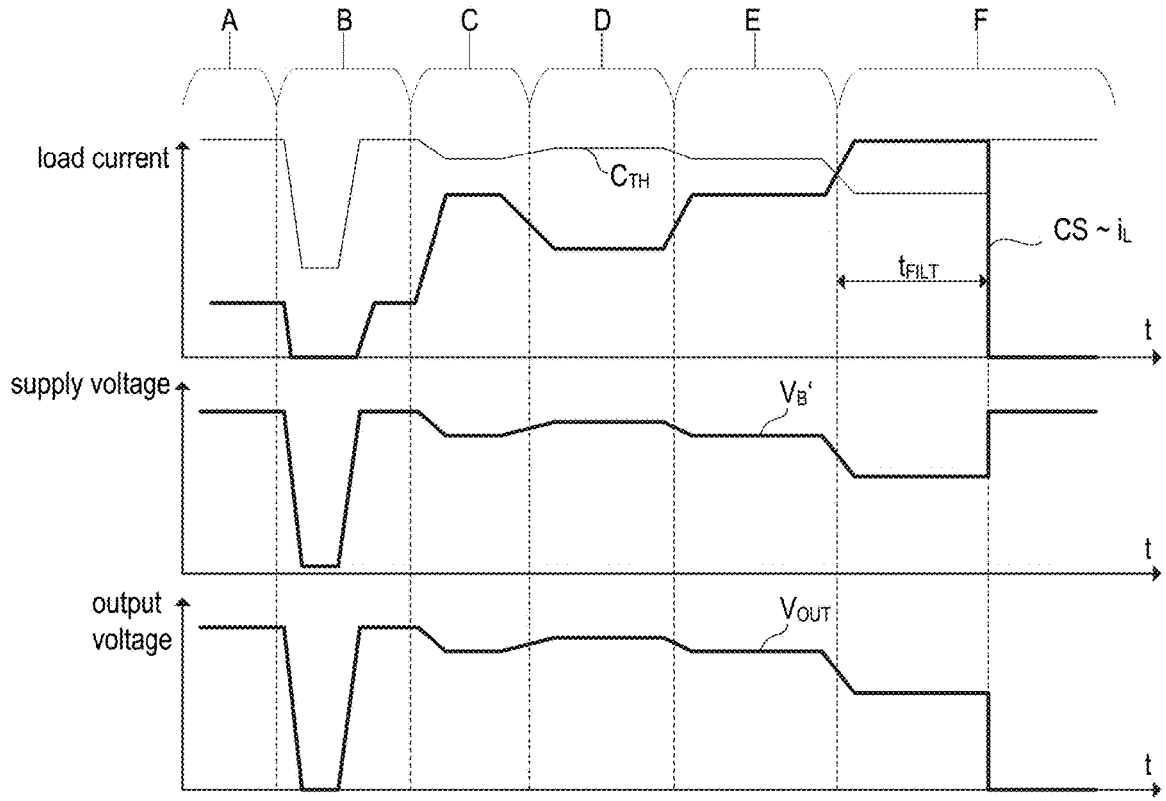
FIG. 8 includes timing diagrams illustrating the function of an alternative embodiment.

In the example of FIG. 8, the under-voltage threshold $V_{UVTH}$ is constantly at $V_{B,min}$, and the current threshold value $CS_{TH}$ is proportional to the supply voltage $V_B'$ (plus optionally an offset). Using this approach, a similar effect can be achieved like in the previous case of FIGS. 6 and 7, namely at a relatively high load current, a smaller supply voltage drop is sufficient to trigger a switch-off of transistor 2 (e.g., after a filter time $t_{FILT}$). In a further embodiment, the current threshold value $CS_{TH}$ is not proportional to the supply voltage $V_B'$ but rather depends on the supply voltage $V_B'$ in accordance with a non-linear function, e.g. a step function with or without hysteresis (analogously to the example of FIG. 6).

Figure 9:
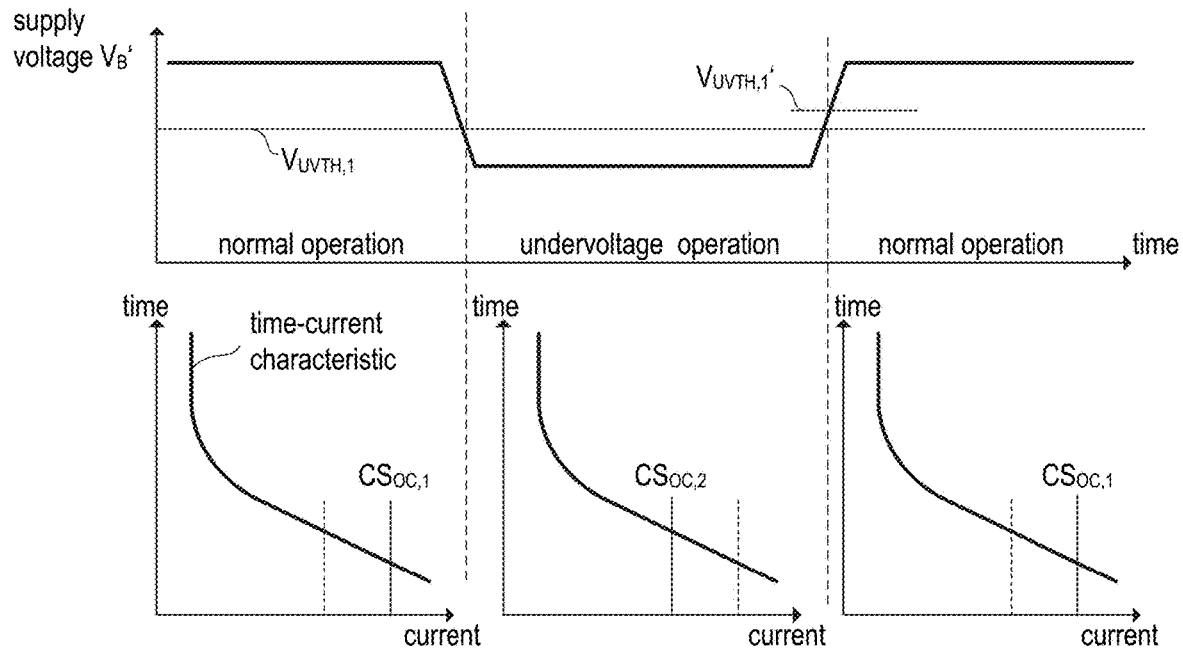
FIGS. 9 and 10 illustrate the function of a further embodiments, in which a switch-off of the load current is triggered using a current-time characteristic.

In some embodiments, an over-current shown-down is not triggered using a simple comparator threshold. Instead a specific current-time-characteristic may be used. The current-time-characteristic may be designed to emulate the behavior of a conventional fuse, which is blown when the current passing through the fuse exceeds a critical power for a specific amount of time, wherein the power can be higher the shorter the considered time window is. The concept of using current-time characteristics to emulate a fuse behavior is as such known. FIG. 9 illustrates an example of such a current-time-characteristic, wherein two different modes of operation are distinguished, namely normal operation and under-voltage operation.

FIG. 9 includes an exemplary signal waveform of the supply voltage $V_B'$ and the corresponding current-time-characteristics. Also shown is a current threshold value $i_{CSTH}$ which is used to immediately trigger a switch-off of the transistor when the load current exceeds the current threshold value $i_{CSTH}$. Below the threshold value $i_{CSTH}$ a switch-off is triggered after a specific time determined by the current-time-characteristics, wherein for sufficiently low currents, the time is infinite (i.e., a switch-off will not occur for low currents). In the example of FIG. 9, the current threshold value $i_{CSTH}$ depends on the supply voltage $V_B'$ (like in the previous example), wherein, in the present example, the current threshold value $CS_{OC}$ is adjusted from $CS_{OC,1}$ to a lower value $CS_{OC,2}$ in reaction to the supply voltage $V_B'$ falling below an under-voltage threshold $V_{UVTH}=V_{UVTH,1}$ and reset to the initial value $CS_{OC,1}$ once the supply voltage $V_B'$ again exceeds the under-voltage threshold $V_{UVTH}$. Again, slightly different thresholds may be used (e.g., $V_{UVTH,1}$ and $V_{UVTH,1}+\varepsilon$) to implement a small hysteresis. If the current sense signal CS exceeds the current threshold value $CS_{OC}$ (equal to $CS_{OC,1}$ or $CS_{OC,2}$ dependent on the supply voltage level) an over-current switch off—may be triggered.

Figure 10:
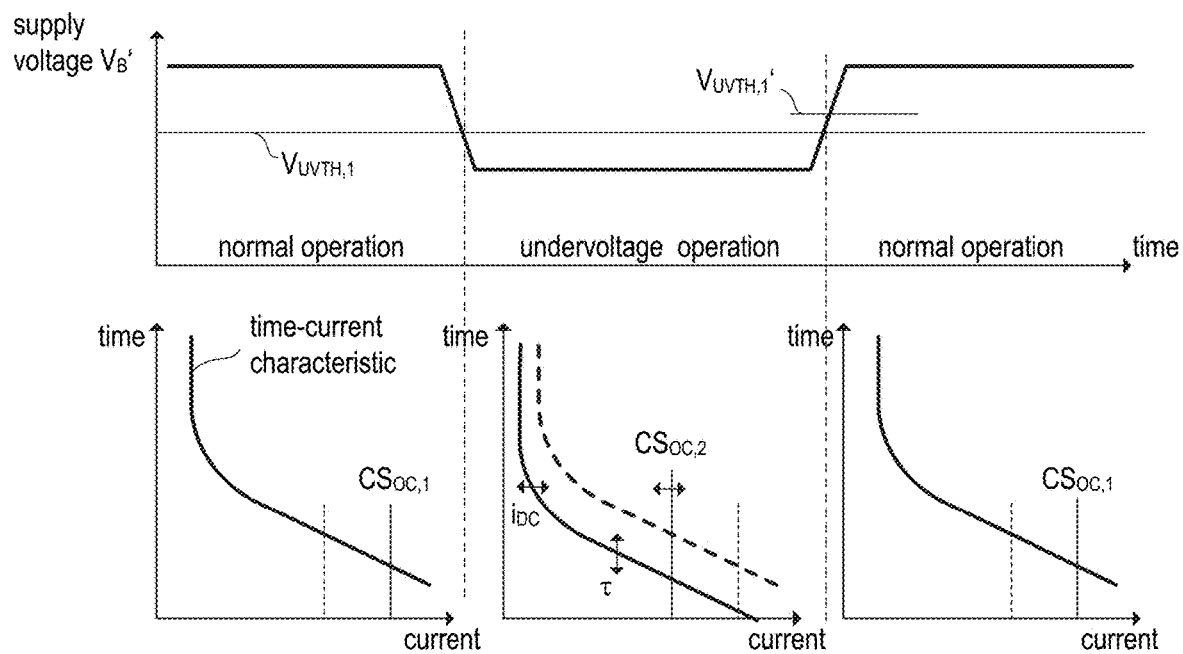

A further modification/enhancement of the example of FIG. 9 is illustrated in FIG. 10. According to the aspect shown illustrated in FIG. 10, the current monitoring circuit is configured to signal an over-current state based on the current sense signal CS and a predetermined current-time characteristic which depends on a supply voltage $V_B'$ received at the supply pin SUP. Accordingly, the current-time characteristic is adjusted and modified, for example, when the supply voltage $V_B'$ drops below an under-voltage threshold value $V_{UVTH}=V_{UVTH,1}$. As can be seen in FIG. 10, the characteristic current-time curve is shifted towards shorter time intervals as well towards lower currents during under-voltage operation (i.e., while $V_B'<V_{UVTH,1}$).

Figure 11:
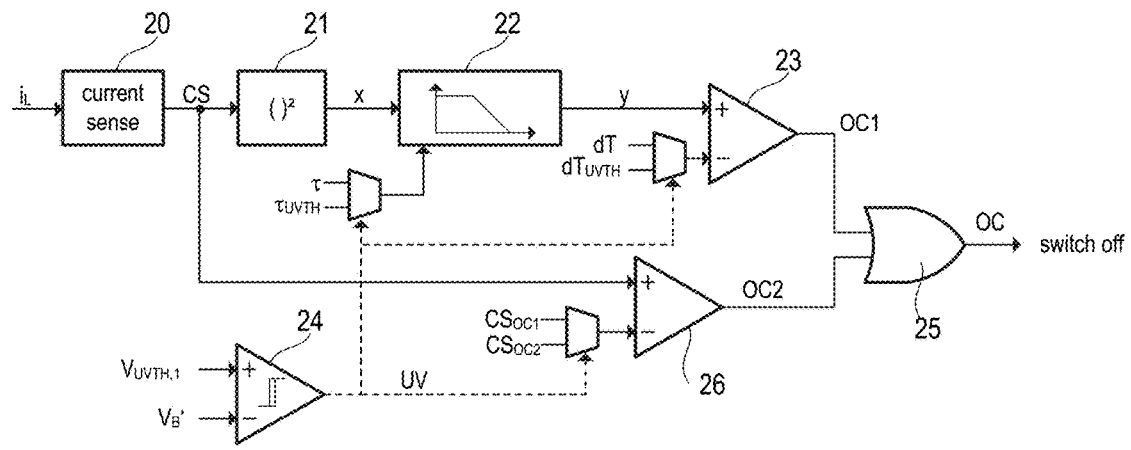
FIG. 11 illustrates a current monitoring circuit related to the timing diagrams of FIGS. 9 and 10.

FIG. 11 illustrates one example of how the current-time characteristics shown in FIGS. 9 and 10 can be implemented. FIG. 11 illustrates one exemplary implementation of a current monitoring circuit including the current sense circuit 20 (see also FIGS. 1 and 4), a squaring unit 21, a filter 22 and a comparator 23. The squaring unit 21 provides the signal x which represents the squared load current signal ($x \sim i_{L2}$, x is proportional to $i_{L2}$). The filter 22 may be a low-pass filter, e.g. a first order low-pass filter, whose transfer behavior is characterized by a selectable time constant $\tau$ or $\tau_{UVTH}$ and a DC gain. The filtered signal y may be interpreted as a temperature difference $\Delta T$ above ambient temperature. When the filtered signal y exceeds a selectable threshold value dT or $dTuV_{TH}$ the comparator 23 signals an over-current state by setting the comparator output signal OC1, e.g., to a high level. In the example of FIG. 11, an additional over-current switch-off can be triggered by comparator 26 when the current sense signal CS exceeds a selectable current threshold level $CS_{OC}$, i.e. either $CS_{OC,1}$ or $CS_{OC,2}$ (see FIGS. 9 and 10). The comparator 26 may indicate an over-current by setting its output signal OC2 to a high level.

It should be emphasized at this point that not only the over-current threshold $CS_{OC}$ is modified when the supply voltage $V_B'$ falls below the under-voltage threshold value $V_{UVTH}=V_{UVTH,1}$; additionally or alternatively, the current-time-characteristic may be modified, e.g. by changing the time-constant $\tau$ or $\tau_{UVTH}$ and/or the DC gain or the temperature threshold (dT or $dT_{UVTH}$) which has a similar effect to changing the DC gain. In the example of FIG. 11, the condition $V_B'<V_{UVTH,1}$ (cf. FIG. 10) is detected by comparator 24 and signaled by the comparator output signal UV. Dependent on the comparator output signal UV, the current threshold for comparator 26 ($CS_{OC,1}$ or $CS_{OC,2}$) may be selected. Also dependent on the output signal UV, the current-time characteristic of the current monitor circuit (including squaring unit 21, filter 22, and comparator 23) may be changed by selecting the filter time constant ($\tau$ or $\tau_{UVTH}$) and/or the temperature threshold value (dT or $dT_{UVTH}$). The output signals OC1 and OC2 may be combined using an OR gate 25 and the combined logic signal OC may be used to trigger a switch-off of the electronic switch 2 (e.g., via control logic 3 and gate driver 5, cf. FIG. 4). Alternatively, the signal OC2 indicating an over-current may be used to activate a current-limitation mechanism. Such a current-limitation mechanism may be included, e.g., in the gate driver circuit 5 (cf. FIG. 4). It is noted that circuits for over-current shut-down and circuits for current-limitation are as such known and therefore not further described herein.

Figure 12:
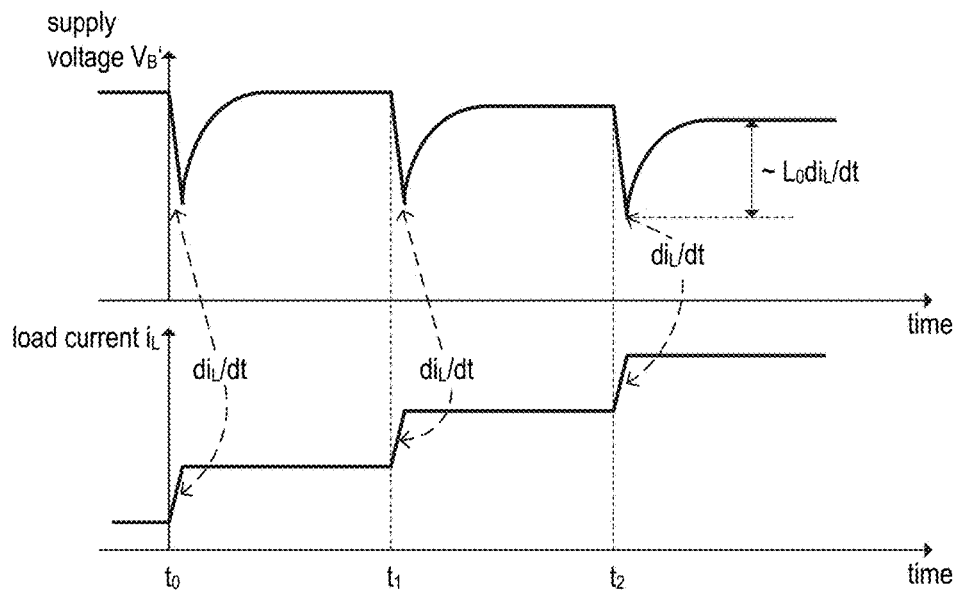
FIG. 12 illustrates transient voltage drops due to a load current gradient.

In all embodiments described herein, it may be desirable to ignore an under-voltage signal UV signaling an under-voltage state if the duration of the under-voltage state is very short (e.g., only a few microseconds). Such short under-voltage "spikes" (short, transient voltage dips) may occur, for example, when the impedance $Z_0$ between the voltage source (e.g., the battery) and the smart switches includes a significant inductance $L_0$($Z_0=R_0+j\cdot\omega\cdot L_0$). In this case a load-current gradient $di_L/dt$, which may occur due to a switching process in the load, will result in a voltage drop dependent on (in particular proportional to) $L_0\cdot di_L/dt$. This effect is visualized in the example of FIG. 12. To avoid undesired effects, short under-voltage spikes may be ignored. In the example of FIG. 7, a short drop of the voltage $V_B'$ received at the smart switch can be ignored so that it will have practically no effect on the over-current threshold $C_{TH}$. "Ignoring" the transient voltage dips may be accomplished, e.g., by a simple RC filter coupled between the pin SUP, at which the supply voltage is received, and the input of the comparator 6 (see FIG. 4). Alternatively, digital electronics may be used to eliminate short, transients in the under-voltage signal UV.

Although the invention has been illustrated and described with respect to one or more implementations, alterations and/or modifications may be made to the illustrated examples without departing from the spirit and scope of the appended claims. For example, the logic levels used to trigger a specific action may be inverted as compared to the depicted examples. Logic gates may be replaced by other logic circuits that perform substantially the same function, etc. In particular regard to the various functions performed by the above described components or structures (units, assemblies, devices, circuits, systems, etc.), the terms used to describe such components are intended to correspond—unless otherwise indicated—to any component or structure, which performs the specified function of the described component (e.g., that is functionally equivalent), even though not structurally equivalent to the disclosed structure, which performs the function in the herein illustrated exemplary implementations of the invention.

What is claimed is:
1. A circuit for driving an electronic switch, the circuit comprising:
a control circuit configured to:

trigger a switch-on and a switch-off of the electronic switch in accordance with an input signal,
trigger the switch-off of the electronic switch in response to an under-voltage signal signaling an under-voltage state, and
trigger the switch-off of the electronic switch in response to an over-current signal signaling an over-current state;
an under-voltage detection circuit configured to:
signal the under-voltage state when a supply voltage received at a supply node is below an under-voltage threshold value, wherein the under-voltage threshold value depends on a load current passing through the electronic switch, and
increase the under-voltage threshold value from a first under-voltage value to a second under-voltage value when a current sense signal representing the load current passing through the electronic switch reaches or exceeds a first current threshold value; and
a current monitoring circuit configured to signal the over-current state based on the current sense signal and a current-time characteristic which depends on the supply voltage received at the supply node, wherein the current monitoring circuit comprises:
a filter having a time constant that is configured to be modified based on the supply voltage, and
the filter is configured to receive an first signal that depends on the current sense signal representing the load current passing through the electronic switch.

2. The circuit of claim 1, further comprising:
a current sensing circuit configured to provide the current sense signal representing the load current passing through the electronic switch.

3. The circuit of claim 2, wherein the under-voltage threshold value is a function of the current sense signal.

4. The circuit of claim 3, wherein the function is a linear function.

5. The circuit of claim 2, further comprising:
an over-current detection circuit configured to signal the over-current state when the current sense signal exceeds an over-current threshold value, wherein the control circuit is further configured to trigger the switch-off of the electronic switch in response to the over-current signal indicating the over-current state.

6. The circuit of claim 1, further comprising:
a driver circuit coupled to the control circuit for generating a drive signal for the electronic switch,
wherein the driver circuit is configured to generate the drive signal such that the load current is limited to a maximum value that corresponds to the first current threshold value.

7. The circuit of claim 1,
wherein the first and the second under-voltage values are configurable before or during operation of the circuit.

8. The circuit of claim 1, wherein the under-voltage detection circuit is further configured to:
reset the under-voltage threshold value to the first under-voltage value when the current sense signal drops below a second current threshold value.

9. The circuit of claim 8, wherein:
the first current threshold value is equal to the second current threshold value; or
the second current threshold value is lower than the first current threshold value.

10. The circuit of claim 1, wherein the control circuit is configured to trigger the switch-off of the electronic switch when the under-voltage signal indicates the under-voltage state for at least a filter time.

11. A circuit for driving an electronic switch, the circuit comprising:
a control circuit configured to trigger a switch-on and a switch-off of the electronic switch in accordance with an input signal, wherein the control circuit is further configured to trigger the switch-off of the electronic switch in response to an over-current signal signaling an over-current state; and
a current monitoring circuit configured to signal the over-current state based on a current sense signal and a current-time characteristic which depends on a supply voltage received at a supply node, wherein the current monitoring circuit comprises:
a filter having a time constant that is configured to be modified based on the supply voltage, and
the filter is configured to receive an first signal that depends on the current sense signal representing a load current through the electronic switch.

12. The circuit of claim 11, wherein the time constant of the filter is configurable to modify the current-time characteristic.

13. The circuit of claim 11, wherein the current monitoring circuit includes a comparator configured to compare a filtered output of the filter with a reference value.

14. The circuit of claim 13, wherein the reference value is configurable to modify the current-time characteristic.

15. A method of operating a circuit for driving an electronic switch, the method comprising:
triggering a switch-on and a switch-off of the electronic switch in accordance with an input signal;
triggering the switch-off of the electronic switch in response to a first over-current signal signaling a first over-current state;
filtering a current sense signal representing a load current through the electronic switch according to a time constant to produce a filtered current sense signal;
monitoring a supply voltage of the electronic switch;
modifying the time constant according to the monitored supply voltage; and
signaling the first over-current state based on the filtered current sense signal.

16. The method of claim 15, wherein monitoring the supply voltage comprises comparing the supply voltage to at least one voltage threshold.

17. The method of claim 16, wherein modifying the time constant comprises:
selecting a first time constant when the supply voltage is greater than the at least one voltage threshold; and
selecting a second time constant when the supply voltage is below the at least one voltage threshold.

18. The method of claim 15, further comprising:
comparing the current sense signal to a current threshold;
generating a second over-current signal in response to the comparing; and
triggering the switch-off of the electronic switch in response to the second over-current signal.

19. The method of claim 18, further comprising:
decreasing the current threshold from a first value to a second value when the supply voltage drops below a first voltage threshold value; and
increasing the current threshold to the first value when the supply voltage signal increases above a second voltage threshold value.

20. The method of claim 19, wherein the first voltage threshold value is different from the second voltage threshold value.

* * * * *